US009472572B2

(12) United States Patent
Zang

(10) Patent No.: US 9,472,572 B2
(45) Date of Patent: Oct. 18, 2016

(54) FIN FIELD EFFECT TRANSISTOR (FINFET) DEVICE INCLUDING A SET OF MERGED FINS FORMED ADJACENT A SET OF UNMERGED FINS

(71) Applicant: GLOBALFOUNDRIES Inc., Grand Cayman (KY)

(72) Inventor: Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 92 days.

(21) Appl. No.: 14/270,833

(22) Filed: May 6, 2014

(65) Prior Publication Data

US 2015/0325692 A1  Nov. 12, 2015

(51) Int. Cl.
| | |
|---|---|
| *H01L 27/12* | (2006.01) |
| *H01L 29/78* | (2006.01) |
| *H01L 29/66* | (2006.01) |
| *H01L 21/8234* | (2006.01) |
| *H01L 21/8238* | (2006.01) |
| *H01L 21/84* | (2006.01) |
| *H01L 27/088* | (2006.01) |
| *H01L 27/092* | (2006.01) |
| *H01L 29/165* | (2006.01) |

(52) U.S. Cl.
CPC ... *H01L 27/1211* (2013.01); *H01L 21/823431* (2013.01); *H01L 21/823481* (2013.01); *H01L 21/823821* (2013.01); *H01L 21/845* (2013.01); *H01L 27/0886* (2013.01); *H01L 27/0924* (2013.01); *H01L 29/66* (2013.01); *H01L 29/66553* (2013.01); *H01L 29/66795* (2013.01); *H01L 29/785* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 6,258,692 B1* | 7/2001 | Chu | H01L 21/76229 257/E21.548 |
| 6,756,643 B1* | 6/2004 | Achuthan | H01L 21/3212 257/347 |
| 2009/0108354 A1* | 4/2009 | Fujimoto | H01L 21/823431 257/347 |
| 2011/0204419 A1 | 8/2011 | Johnson et al. | |
| 2012/0104472 A1 | 5/2012 | Xu et al. | |
| 2013/0234250 A1 | 9/2013 | Lin et al. | |
| 2014/0061794 A1 | 3/2014 | Cheng et al. | |
| 2014/0191330 A1* | 7/2014 | Cheng | H01L 21/823431 257/390 |

\* cited by examiner

*Primary Examiner* — Anthony Ho
*Assistant Examiner* — Kevin Quinto
(74) *Attorney, Agent, or Firm* — Williams Morgan, P.C.

(57) ABSTRACT

Approaches for simultaneously providing a set of merged and unmerged fins in a fin field effect transistor device (FinFET) are disclosed. In at least one approach, the FinFET device includes: a set of merged fins and a set of unmerged fins formed from a substrate, the set of unmerged fins adjacent the set of merged fins; and a planar block formed from the substrate, the planar block adjacent one of: the set of merged fins, and the set of unmerged fins. The FinFET device further includes an epitaxial material over each of the set of merged fins and each of the set of unmerged fins, wherein the epitaxial material merges together over the set of merged fins and remains unmerged over the set of unmerged fins. In at least one approach, the set of merged fins and the set of unmerged fins is formed using a sidewall image transfer process.

14 Claims, 7 Drawing Sheets

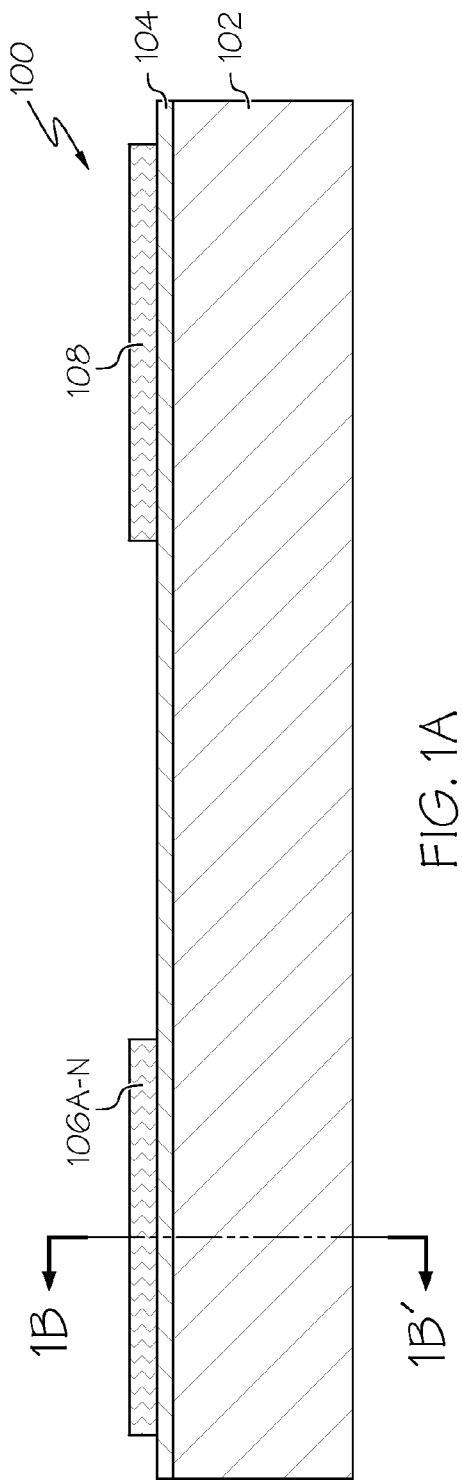
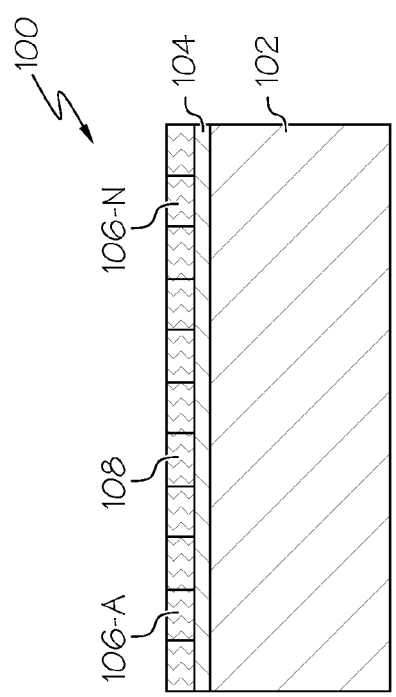
FIG. 1A
FIG. 1B

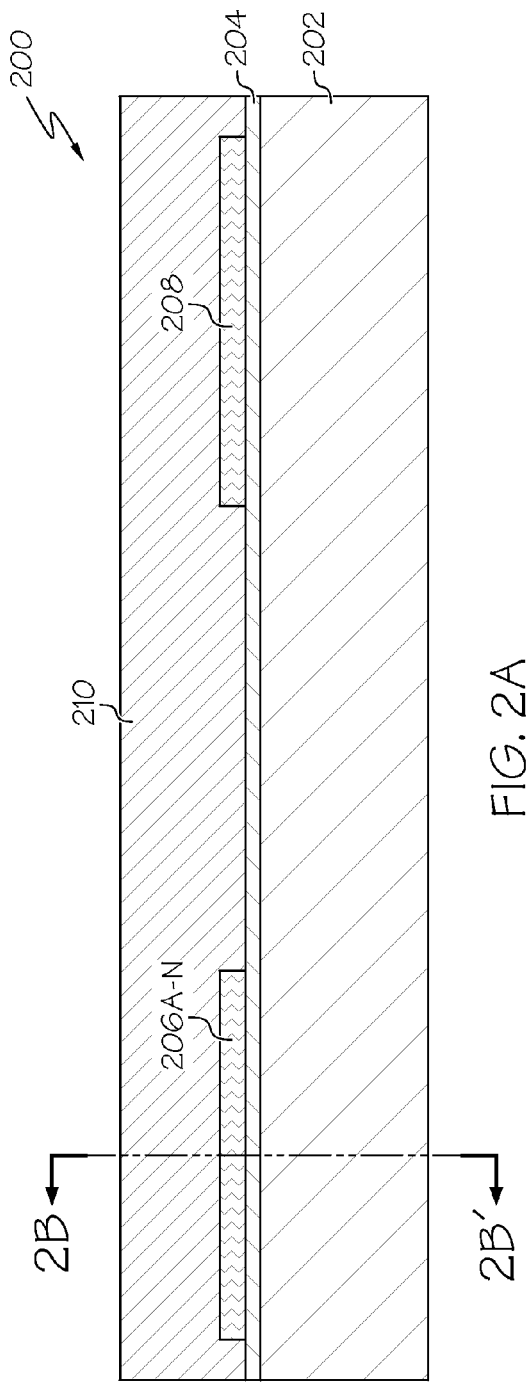
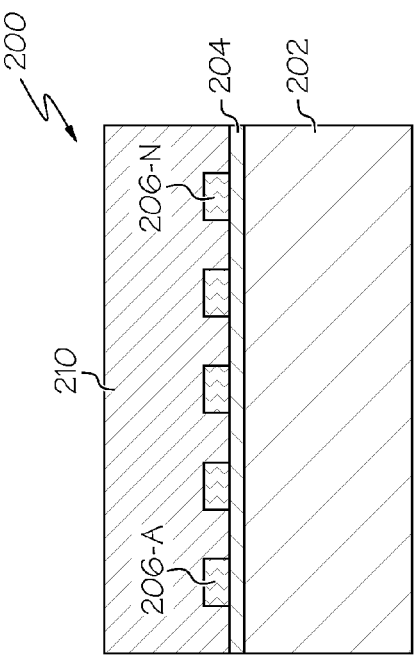
FIG. 2A
FIG. 2B

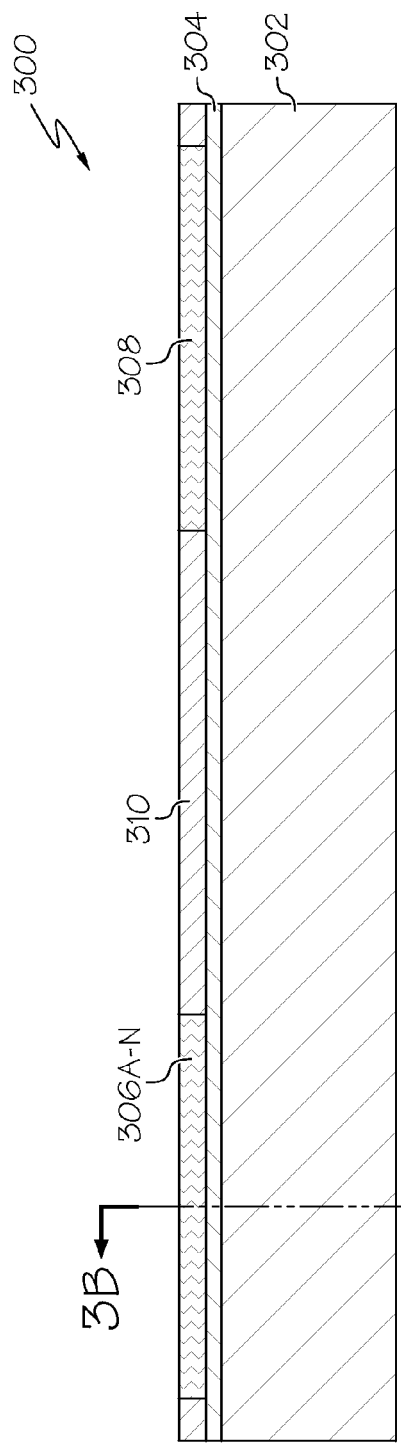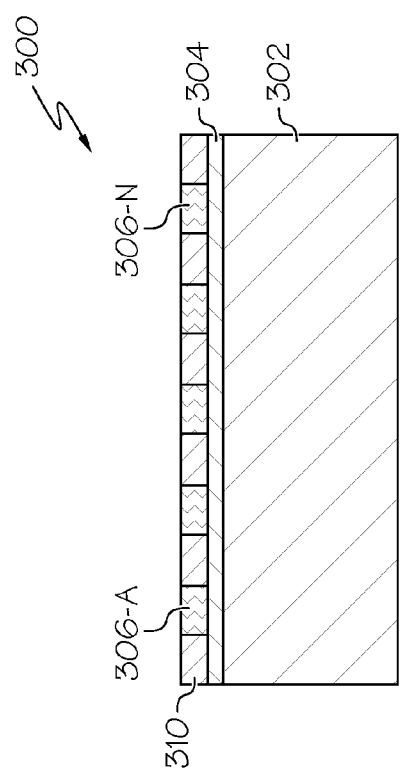

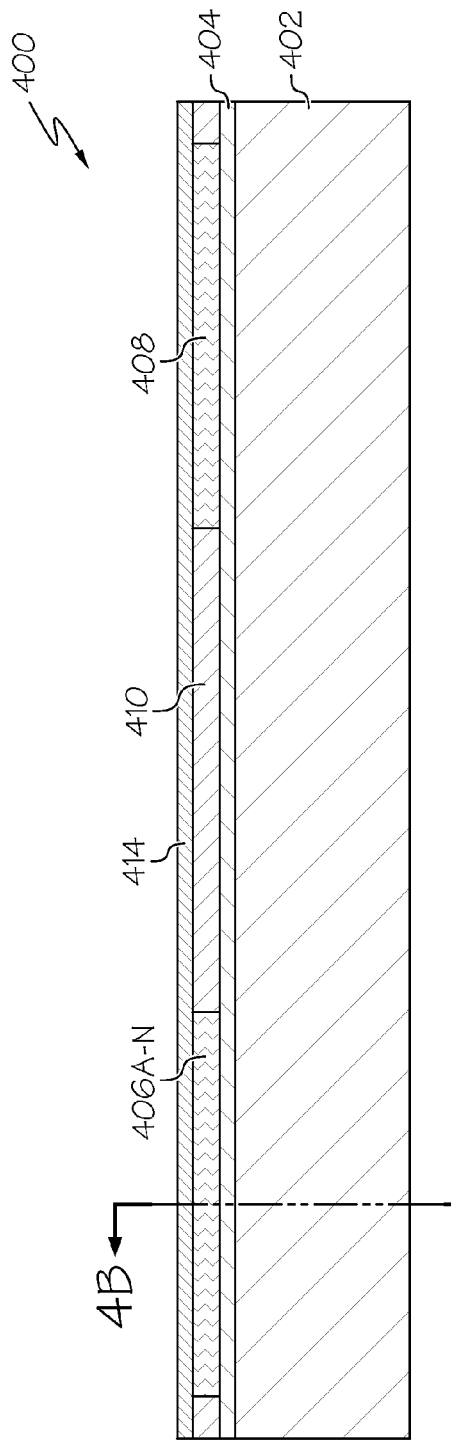
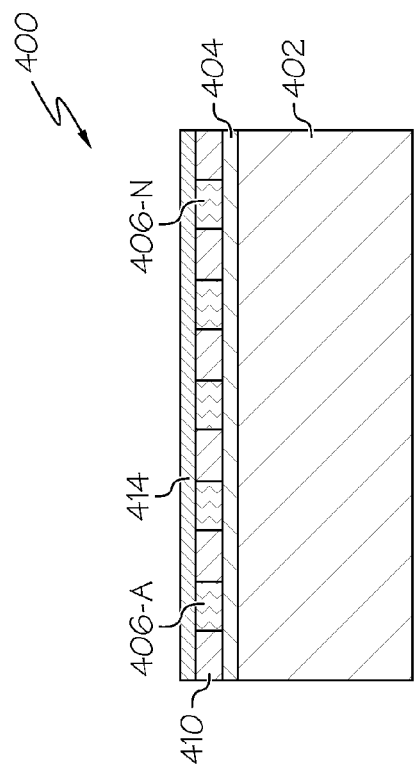
FIG. 4A
FIG. 4B

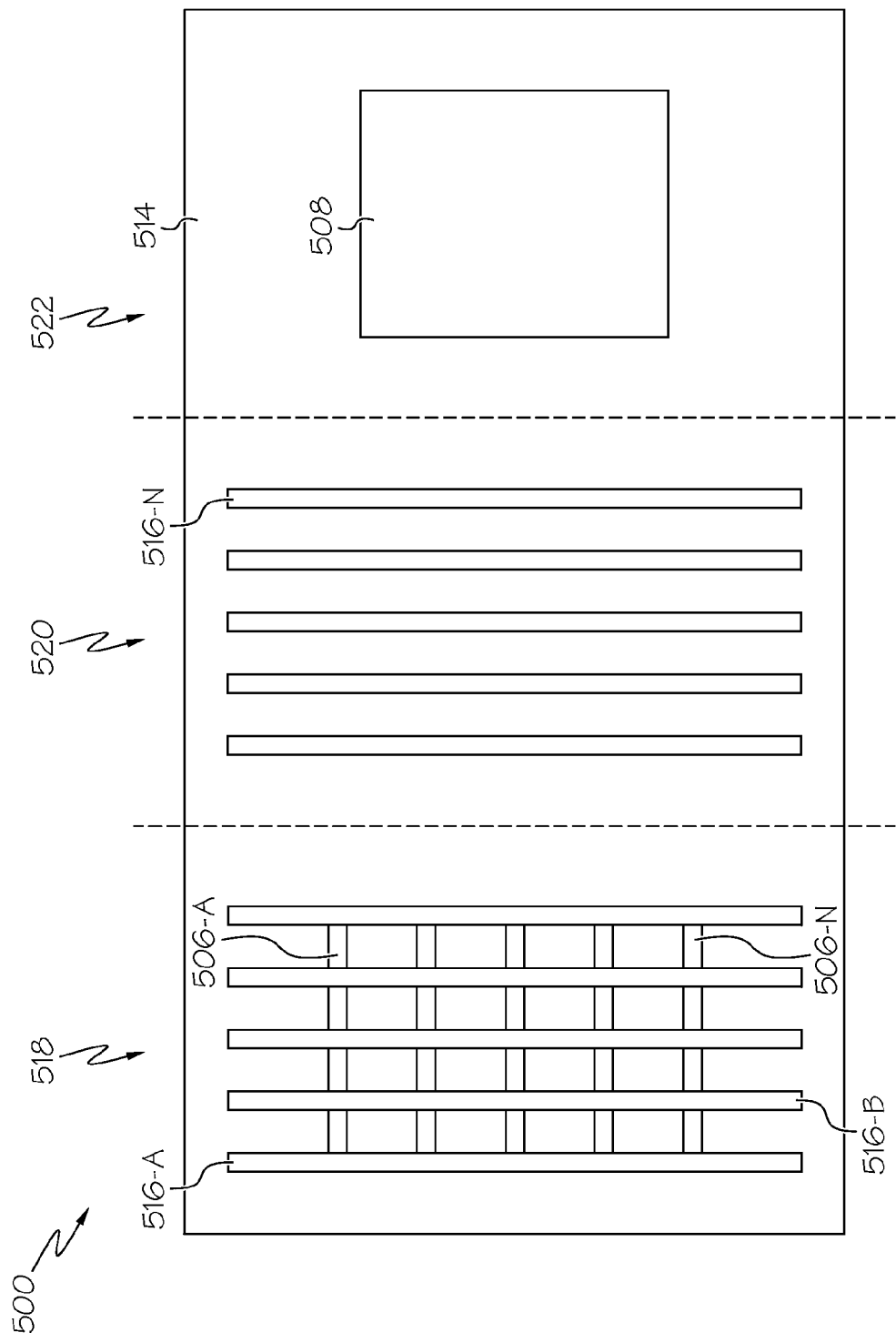

FIN FIELD EFFECT TRANSISTOR (FINFET) DEVICE INCLUDING A SET OF MERGED FINS FORMED ADJACENT A SET OF UNMERGED FINS

BACKGROUND

1. Technical Field

This invention relates generally to the field of semiconductors, and more particularly, to forming a set of merged and unmerged fins of a FinFET device.

2. Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state-of-the-art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well-known photolithographic masking, developing, and level definition, e.g., etching, implanting, depositing, etc.

The FinFET is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

Device parameters of FinFETs are extremely sensitive to semiconductor fin thickness. In order to realize the full potential of a FinFET, the silicon fin must be very thin (e.g., on the same order of thickness as that of a fully-depleted SOI). Similarly, line width control problems during gate electrode definition for small devices can lead to performance degradation, power consumption control issues, and yield loss. Previously, lithographic techniques have been used to form device components (e.g., semiconductor fins for FinFETs, gate electrodes, etc.) in a substrate. Using photolithography, a feature can be printed directly into a photo-resist layer, and the image can be transferred into an underlying film. However, current state-of-the-art lithographic technology cannot adequately and efficiently satisfy the ever-increasing demand for smaller devices and device components. Thus, the requirement for very thin and replicable device components encourages the use of a sidewall image transfer (SIT) process to form such components.

SIT involves the usage of a sacrificial structure (e.g., a mandrel, typically composed of a polycrystalline silicon) and a sidewall spacer (such as silicon dioxide or silicon nitride, Si3N4, for example), having a thickness less than that permitted by the current ground rules, which is formed on the sides of the mandrel (e.g., via oxidization or film deposition and etching). After removal of the mandrel, the remaining sidewall spacer is used as a hardmask (HM) to etch the layer(s) below, e.g., with a directional reactive ion etch (RIE). In other uses, the sidewall may be used as a component in the desired structure (e.g., as a portion of the fins in a FinFET).

Such three-dimensional geometry, which is provided by multi-gated fully depleted non-planar semiconductor devices, and the need for continued external resistance ($R_{ext}$) scaling sometimes necessitates merging of the source/drain regions by growing an epitaxial (epi) semiconductor material on the source/drain regions, or some other intimate electrical contact to the fin sidewalls. In another approach, the epi growth is unmerged, which provides better SRAM density and a better SRAM yield window over that provided by the merged epi material. However, the unmerged epi material shows significant degradation in device performance as compared to the merged epi-growth. As such, selection of one approach over the other (i.e., merged vs. unmerged epi) leads to sub-optimal results because tradeoffs exist with both.

SUMMARY

In general, approaches for simultaneously providing a set of merged fins adjacent a set of unmerged fins in a fin field effect transistor device (FinFET) are disclosed. In at least one approach, the FinFET device includes: a set of merged fins formed from a substrate; a set of unmerged fins formed from the substrate, the set of unmerged fins adjacent the set of merged fins; and a planar block formed from the substrate, the planar block adjacent one of: the set of merged fins, and the set of unmerged fins. The FinFET device further includes an epitaxial material over each of the set of merged fins and each of the set of unmerged fins, wherein the epitaxial material merges together over the set of merged fins and remains unmerged over the set of unmerged fins. In at least one approach, the set of merged fins and the set of unmerged fins is formed using a sidewall image transfer (SIT) process.

One aspect of the present invention includes a method for forming a fin field effect transistor (FinFET) device, the method comprising: forming a set of merged fins from a substrate; forming a set of unmerged fins from the substrate, the set of unmerged fins adjacent the set of merged fins; and forming a planar block from the substrate, the planar block adjacent one of: the set of merged fins, and the set of unmerged fins.

Another aspect of the present invention includes a set of merged fins adjacent a set of unmerged fins in fin field effect transistor (FinFET) device, the method comprising: forming a set of merged fins from a substrate; forming a set of unmerged fins from the substrate, the set of unmerged fins adjacent the set of merged fins; and forming a planar block from the substrate, the planar block adjacent the set of unmerged fins.

Yet another aspect of the present invention includes a fin field effect transistor (FinFET) device comprising: a set of merged fins formed from a substrate; a set of unmerged fins formed from the substrate, the set of unmerged fins adjacent the set of merged fins; and a planar block formed from the substrate, the planar block adjacent one of: the set of merged fins, and the set of unmerged fins.

BRIEF DESCRIPTION OF THE DRAWINGS

These and other features of this invention will be more readily understood from the following detailed description of the various aspects of the invention taken in conjunction with the accompanying drawings in which:

FIG. 1(A) shows a cross-sectional view of a FinFET device following formation of a set of merged fin structures and a planar block structure according to illustrative embodiments;

FIG. 1(B) shows a cross-sectional view of the FinFET device of FIG. 1(A) along cut-line 1B-1B';

FIG. 2(A) shows a cross-sectional view of the FinFET device following formation of a hardmask layer according to illustrative embodiments;

FIG. 2(B) shows a cross-sectional view of the FinFET device of FIG. 2(A) along cut-line 2B-2B';

FIG. 3(A) shows a cross-sectional view of the FinFET device following removal of the hardmask layer over the oxide layer according to illustrative embodiments;

FIG. 3(B) shows a cross-sectional view of the FinFET device of FIG. 3(A) along cut-line 3B-3B';

FIG. 4(A) shows a cross-sectional view of the FinFET device following formation of another hardmask layer over the set of merged fin structures and the planar block structure layer according to illustrative embodiments;

FIG. 4(B) shows a cross-sectional view of the FinFET device of FIG. 4(A) along cut-line 4B-4B';

FIG. 5 shows a top view of the FinFET device following formation of a set of spacers according to illustrative embodiments;

Figure 6:
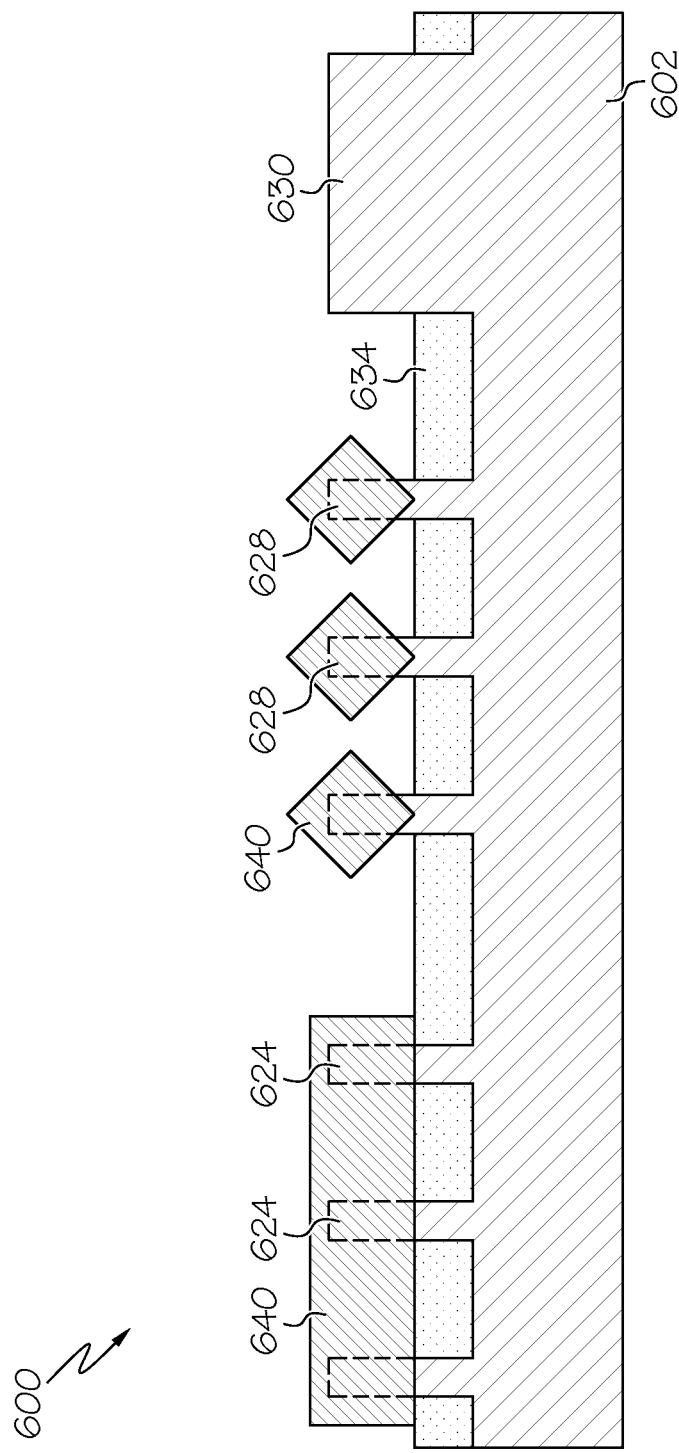
FIG. 6 shows a cross-sectional view of a set of merged fins and a set of unmerged fins of the FinFET device according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As stated above, approaches for simultaneously providing a set of merged fins adjacent a set of unmerged fins in FinFET device are disclosed. In at least one approach, the FinFET device includes: a set of merged fins formed from a substrate; a set of unmerged fins formed from the substrate, the set of unmerged fins adjacent the set of merged fins; and a planar block formed from the substrate, the planar block adjacent one of: the set of merged fins, and the set of unmerged fins. The FinFET device further includes an epitaxial material over each of the set of merged fins and each of the set of unmerged fins, wherein the epitaxial material merges together over the set of merged fins and remains unmerged over the set of unmerged fins. In an exemplary embodiment, the set of merged fins and the set of unmerged fins is formed using a sidewall image transfer (SIT) process.

With reference again to the figures, FIGS. 1(A)-(B) demonstrate an initial processing step for forming a plurality of fins of a FinFET device 100 (hereinafter "device") according to illustrative embodiments of the invention. As provided for ease of explanation, FIG. 1(A) shows a cross-sectional view of device 100 along a first direction, while FIG. 1(B) shows a generally perpendicular cross-sectional view of device 100 of FIG. 1(A) along cut-line 1B-1B'. In exemplary embodiments, device 100 comprises a substrate 102, and a first hardmask 104 (e.g., nitride or silicon nitride (SiN)) formed over substrate 102). The term "substrate" as used herein is intended to include a semiconductor substrate, a semiconductor epitaxial layer deposited or otherwise formed on a semiconductor substrate, and/or any other suitable type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion of or the entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain. In one embodiment, first hardmask 104 may comprise silicon nitride (SiN), silicon dioxide (SiO2), or any other material(s) suitable as a hardmask, including silicon oxynitride (SiON), silicon oxycarbide (SiOC), and the like. First hardmask 104 can be prepared by PVD, CVD, spin coating, etc., depending on the material. It will be appreciated that first hardmask 104 may comprise multiple stacked layers, and is not necessarily limited to the uniform layer shown.

Device 100 further includes a plurality of merged fin structures 106A-N and a planar block structure 108 patterned from an oxide layer formed over first hardmask 104. In alternative embodiments, merged fin structures 106A-N and planar block structure 108 are formed from an inorganic, organic, and/or dielectric material such as amorphous silicon, polycrystalline silicon, or silicon oxide ($SiO_x$) where x is a number greater than zero, silicon nitride ($Si_3N_4$), silicon oxynitride (SiON), or the like. Although not specifically shown, it will be appreciated that merged fin structures 106A-N and planar block structure 108 are patterned to the configuration shown, e.g., using a photo-lithography process or other lithographic process (e.g., electron beam lithography, imprint lithography, EUV lithography, etc.), and removed by a suitable etching process including a wet etch, dry etch, plasma etch, and the like.

Next, as shown by device 200 in FIGS. 2(A)-(B), a second hardmask 210 (e.g., nitride or SiN) is formed over device 200 and then removed (e.g., via CMP) to a top surface of merged fin structures 306A-N and planar block structure 308, as shown in FIGS. 3(A)-(B). A third hardmask (e.g., nitride or SiN) 414 is then formed over device 400, as shown in FIGS. 4(A)-(B).

Next, as shown in FIG. 5, a set of spacer layers 516A-N is formed over third hardmask 514, e.g., along the sidewalls of a patterned mandrel layer (not shown). As is known, spacer layers 516A-N provide a protective dielectric layer on the sidewalls of the mandrel layer. In one embodiment, the material of spacer layers 516A-N is selected to provide a material that will not be substantially etched by the etchant that subsequently removes the mandrel layer. Spacer layers 516A-N may comprise, for instance, silicon dioxide, silicon nitride, oxide, etc., and are formed using a sidewall image transfer (SIT) atomic layer deposition (ALD) and etch processes. In an exemplary embodiment, spacer layers 516A-N are formed over merged fin structures 506A-N in a merged fin region 518 of device 500, as well as in an unmerged fin region 520. However, as shown, no spacer layers are provided over planar block structure 508 in a planar block region 522 of device 500.

The SIT process then continues, whereby any material left exposed by spacer layers 516A-N is removed. In one embodiment, spacer layers 516A-N are etched back to expose the top surfaces of the patterned mandrel layer, and the patterned mandrel layer is removed, leaving a portion of spacer layers 516A-N that was located on the sides of the patterned mandrel layer. Furthermore, those portions of third hardmask 514 not protected by spacer layers 516A-N are removed.

Spacer layers 516A-N are then used to pattern a plurality of fins, as shown by device 600 in FIG. 6. Specifically, a fin etch process is performed, whereby a set of openings are extended into substrate 602 to form a set of merged fins 624 adjacent a set of unmerged fins 628. In one embodiment, substrate 602 is etched using a highly anisotropic dry etch (e.g., $SF_6/CH_2F_2/O_2/Ar$, modulating bias, pressure, and power, etc.). Device 600 further includes a planar block 630 formed from substrate 602, wherein planar block 630 is located adjacent unmerged fins 628.

A shallow trench isolation (STI) material 634 is formed on the sides of each of merged fins 624 and unmerged fins 628. In various embodiments, STI material 634 can be formed using a conventional CVD or spin on process, on substrate 602. STI material 634 can be formed from oxide or other insulator material. In one embodiment, STI material 634 can be formed by depositing an oxide material over each of the fins, and planarizing the oxide material using a conventional chemical mechanical polishing (CMP) process. The oxide material can then be etched to form a recessed portion, exposing a portion of the sidewalls of each of the fins.

As further shown in FIG. 6, device 600 includes an epitaxial material 640 formed over merged fins 624 and unmerged fins 628. In one embodiment, epitaxial material 640 is formed by an epitaxial growth process with in-situ doping. As shown in FIG. 6, epitaxial material 640 merges together over set of merged fins 624 and remains unmerged over set of unmerged fins 628. In an exemplary embodiment, a substantially uniform film of epitaxial material 640 (e.g., SiGe) is grown on merged fins 624 and unmerged fins 628. However, due to the presence of merged fin structures 506A-N (FIG. 5), which are substantially perpendicular to merged fins 624, more of epitaxial material 640 accumulates between each of merged fins 624 relative to unmerged fins 628. Therefore, as epi-growth continues, one large epi-merged layer is formed over merged fins 624, while epitaxial material 640 over unmerged fins 628 remains unmerged. Thus, it is possible to form set of merged fins 624 adjacent set of unmerged fins 628 in the same epi-processing step and with substantially a same amount of epitaxial material 640. Device 600 therefore provides the benefit of unmerged epi-growth, which provides better SRAM density and a better SRAM yield window over that provided by the merged epi material, and the benefit of merged epi-growth, which reduces device degradation due to the unmerged epi material. Furthermore, the EPI merge eases contact self-alignment during integration, and creates a larger surface area for contacts, thus potentially reducing contact resistance.

In other embodiments, epitaxial material 640 may be polished following growth. By doing so, a relatively uncontrollable EPI growth can be performed and then simply polished back.

Figure 7:
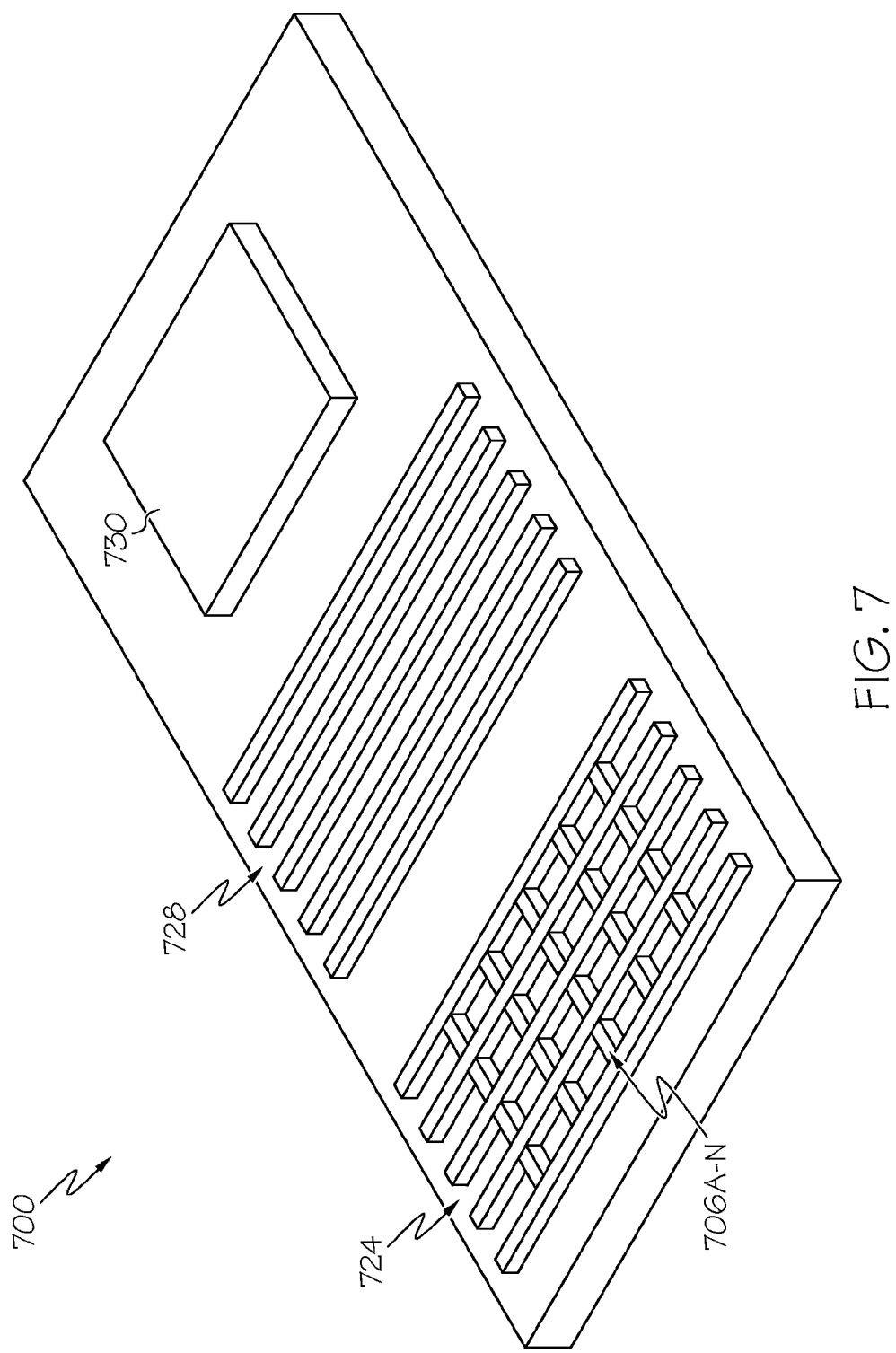
FIG. 7 shows a perspective view of the set of merged fins adjacent the set of unmerged fins of the FinFET device according to illustrative embodiments.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. The tool is capable of producing a FinFET semiconductor device, including device 700 represented in the 3-D perspective view of FIG. 7. As shown, device 700 includes set of merged fins 724 and a set of unmerged fins 728 formed from substrate 702, set of unmerged fins 728 located adjacent set of merged fins 724. Device further includes planar block 730 (e.g., a rectangle) formed from substrate 702, planar block 730 adjacent set of unmerged fins 728.

As used herein, a module might be implemented utilizing any form of hardware, software, or a combination thereof. For example, one or more processors, controllers, ASICs, PLA, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for forming a fin field effect transistor (FinFET) device having a set of merged fins adjacent a set of unmerged fins. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a fin field effect transistor (FinFET) device, comprising:
   forming a set of merged fins from a substrate;
   forming a set of unmerged fins from the substrate, the set of unmerged fins adjacent the set of merged fins; and
   forming a planar block from the substrate, the planar block adjacent one of: the set of merged fins, and the set of unmerged fins;
   wherein forming the set of merged fins, forming the set of unmerged fins, and forming the planar block comprise:
   forming a first hardmask over the substrate;
   patterning a plurality of merged fin structures and a planar block structure over the first hardmask;
   forming a second hard mask over the plurality of merged fin structures and the planar block structure; and
   depositing a third hardmask over the second hardmask.

2. The method according to claim 1, wherein the set of merged fins and the set of unmerged fins are formed using a sidewall image transfer process.

3. The method according to claim 1, the first hardmask, the second hardmask, and the third hardmask comprising one of: silicon, and silicon nitride.

4. The method according to claim 1, further comprising:
   forming a set of spacers over the third hardmask; and
   recessing the substrate that remains uncovered by the set of spacers to form the set of merged fins and the set of unmerged fins.

5. The method according to claim 1, wherein the set of spacers is formed over the set of merged fin structures and over an unmerged region of the FinFET device, the unmerged region of the FinFET device adjacent the set of merged fin structures.

6. The method according to claim 1, further comprising growing an epitaxial material over each of the set of merged fins and each of the set of unmerged fins, wherein the epitaxial material merges together over the set of merged fins, and wherein the epitaxial material remains unmerged over the set of unmerged fins.

7. The method according to claim 1, further comprising providing a shallow trench isolation (STI) material between each of the set of unmerged fins and each of the set of merged fins.

8. A method for forming a fin field effect transistor (FinFET) device, comprising:
   forming a set of merged fins from a substrate;
   forming a set of unmerged fins from the substrate, the set of unmerged fins adjacent the set of merged fins; and
   forming a planar block from the substrate, the planar block adjacent forming a planar block from the substrate, the planar block adjacent the set of unmerged fins;
   wherein forming the set of merged fins, forming the set of unmerged fins, and forming the planar block comprise:
   forming a first hardmask over the substrate;
   patterning a plurality of merged fin structures and a planar block structure over the first hardmask;
   forming a second hard mask over the plurality of merged fin structures and the planar block structure; and
   depositing a third hardmask over the second hardmask.

9. The method according to claim 8, wherein the set of merged fins and the set of unmerged fins are formed using a sidewall image transfer process.

10. The method according to claim 8, the first hardmask, the second hardmask, and the third hardmask comprising one of: silicon, and silicon nitride.

11. The method according to claim 8, further comprising growing an epitaxial material over each of the set of merged fins and each of the set of unmerged fins, wherein the epitaxial material merges together over the set of merged fins, and wherein the epitaxial material remains unmerged over the set of unmerged fins.

12. The method according to claim 8, further comprising providing a shallow trench isolation (STI) material between each of the set of unmerged fins and each of the set of merged fins.

13. The method according to claim 8, further comprising:
   forming a set of spacers over the third hardmask; and
   recessing the substrate that remains uncovered by the set of spacers to form the set of merged fins and the set of unmerged fins.

14. The method according to claim 13, wherein the set of spacers is formed over the set of merged fin structures and over an unmerged region of the FinFET device, the unmerged region of the FinFET device adjacent the set of merged fin structures.

* * * * *